(12) United States Patent
Steiner

(10) Patent No.: US 9,521,764 B2
(45) Date of Patent: Dec. 13, 2016

(54) TAMPER RESPONDENT APPARATUS

(71) Applicant: Timothy Wayne Steiner, Pittsboro, NC (US)

(72) Inventor: Timothy Wayne Steiner, Pittsboro, NC (US)

(73) Assignee: Timothy Steiner, Pittsboro, NC (US)

( * ) Notice: Subject to any disclaimer, the term of this patent is extended or adjusted under 35 U.S.C. 154(b) by 142 days.

(21) Appl. No.: 14/563,902

(22) Filed: Dec. 8, 2014

(65) Prior Publication Data

US 2015/0163933 A1    Jun. 11, 2015

Related U.S. Application Data

(60) Provisional application No. 61/913,845, filed on Dec. 9, 2013.

(51) Int. Cl.
*H05K 5/02* (2006.01)
*B33Y 80/00* (2015.01)

(52) U.S. Cl.
CPC ............. *H05K 5/0208* (2013.01); *B33Y 80/00* (2014.12)

(58) Field of Classification Search
None
See application file for complete search history.

(56) References Cited

U.S. PATENT DOCUMENTS

| | | | | |
|---|---|---|---|---|
| 4,508,640 A * | 4/1985 | Kanda | ............... | H05K 9/0083 252/503 |
| 5,353,350 A * | 10/1994 | Unsworth | ............... | G06F 21/86 257/922 |
| 5,858,500 A * | 1/1999 | MacPherson | ............. | E05G 1/14 264/259 |
| 6,245,992 B1 * | 6/2001 | Hou | ............... | G06F 21/86 174/377 |
| 6,512,454 B2 * | 1/2003 | Miglioli | ............... | G08B 13/149 340/541 |
| 6,686,539 B2 * | 2/2004 | Farquhar | ............... | G06F 21/87 174/525 |
| 6,737,790 B2 * | 5/2004 | Seki | ............... | G02F 1/133385 165/104.33 |
| 6,853,093 B2 * | 2/2005 | Cohen | ............... | H01L 23/576 257/678 |
| 6,929,900 B2 * | 8/2005 | Farquhar | ............... | G06F 21/87 427/96.1 |

(Continued)

*Primary Examiner* — Xanthia C Cunningham
(74) *Attorney, Agent, or Firm* — Ariel S. Bentolila; Bay Area IP, LLC

(57) ABSTRACT

A tamper respondent apparatus having an enclosure comprising of an electrically conductive material layer configured to substantially form continuous electrically conductive paths, an electrically non-conductive material layer forming an outer layer configured to substantially insulate said electrically conductive material layer, an electrical connector at a corner of an underside surface of said enclosure, whereby said conductive material layer and non-conductive material layer are extruded or deposited in successive layers by a three dimensional printer, wherein said electrically conductive material layer forms an inner layer of said extrusion of said three dimensional printer, and wherein a cohesive strength of said conductive material layer is configured to be less than a cohesive strength of said non-conductive material layer.

16 Claims, 2 Drawing Sheets

(56) References Cited

U.S. PATENT DOCUMENTS

| | | | | |
|---|---|---|---|---|
| 6,946,960 B2* | 9/2005 | Sisson | G08B 13/149 | 340/540 |
| 6,957,345 B2* | 10/2005 | Cesana | G08B 13/128 | 713/193 |
| 6,970,360 B2* | 11/2005 | Sinha | G06F 21/86 | 174/541 |
| 6,996,953 B2* | 2/2006 | Perreault | G08B 13/128 | 206/706 |
| 7,007,171 B1* | 2/2006 | Butturini | G06F 21/86 | 257/678 |
| 7,054,162 B2* | 5/2006 | Benson | G06F 21/86 | 257/678 |
| 7,180,008 B2* | 2/2007 | Heitmann | G06F 21/87 | 174/261 |
| 7,247,791 B2* | 7/2007 | Kulpa | H05K 5/0208 | 174/17 R |
| 7,323,986 B2* | 1/2008 | Hunter | G01R 22/066 | 340/545.6 |
| 7,528,733 B2* | 5/2009 | Guichard | A45C 5/02 | 340/550 |
| 7,671,324 B2* | 3/2010 | Fleischman | G01R 31/3708 | 250/227.14 |
| 7,760,086 B2* | 7/2010 | Hunter | G06F 21/87 | 340/540 |
| 7,787,256 B2* | 8/2010 | Chan | G06F 21/87 | 174/250 |
| 7,788,801 B2* | 9/2010 | Oggioni | G06F 21/87 | 29/830 |
| 7,978,070 B2* | 7/2011 | Hunter | G06K 19/073 | 340/545.6 |
| 8,284,387 B2* | 10/2012 | Tucker | G01M 11/3109 | 356/73.1 |
| 8,325,486 B2* | 12/2012 | Arshad | G06F 21/86 | 361/42 |
| 8,589,703 B2* | 11/2013 | Lee | G06F 21/86 | 257/922 |
| 9,104,058 B2* | 8/2015 | Shives | G02F 1/133385 | |
| 9,152,826 B2* | 10/2015 | Zhang | G06F 21/88 | |
| 2001/0056542 A1* | 12/2001 | Cesana | G08B 13/128 | 713/194 |
| 2002/0002683 A1* | 1/2002 | Benson | G06F 21/86 | 713/194 |
| 2002/0014962 A1* | 2/2002 | Miglioli | G08B 13/149 | 340/571 |
| 2005/0207127 A1* | 9/2005 | Sinha | G06F 21/86 | 361/752 |
| 2005/0275538 A1* | 12/2005 | Kulpa | H05K 5/0208 | 340/568.2 |
| 2006/0049941 A1* | 3/2006 | Hunter | G01R 22/066 | 340/545.6 |
| 2006/0075509 A1* | 4/2006 | Kishon | A62C 3/16 | 726/34 |
| 2010/0177487 A1* | 7/2010 | Arshad | G06F 21/86 | 361/737 |
| 2010/0242115 A1* | 9/2010 | Shi | H05K 1/0275 | 726/26 |
| 2012/0250271 A1* | 10/2012 | Chen | H05K 5/0208 | 361/752 |
| 2013/0058057 A1* | 3/2013 | Takemori | H05K 1/0275 | 361/750 |

* cited by examiner

TAMPER RESPONDENT APPARATUS

CROSS-REFERENCE TO RELATED APPLICATIONS

The present Utility patent application claims priority benefit of the [U.S. provisional application for patent Ser. No. 61/913,845 entitled "3d Printed Tamper" filed 2013 Dec. 9 under 35 U.S.C. 119(e). The contents of this related provisional application are incorporated herein by reference for all purposes to the extent that such subject matter is not inconsistent herewith or limiting hereof.

RELATED CO-PENDING U.S. PATENT APPLICATIONS

Not applicable.

FEDERALLY SPONSORED RESEARCH OR DEVELOPMENT

Not applicable.

REFERENCE TO SEQUENCE LISTING, A TABLE, OR A COMPUTER LISTING APPENDIX

Not applicable.

COPYRIGHT NOTICE

A portion of the disclosure of this patent document contains material that is subject to copyright protection. The copyright owner has no objection to the facsimile reproduction by anyone of the patent document or patent disclosure as it appears in the Patent and Trademark Office, patent file or records, but otherwise reserves all copyright rights whatsoever.

FIELD OF THE INVENTION

One or more embodiments of the invention generally relate to tamper respondent enclosures. More particularly, the invention relates to a three-dimensional printed, tamper respondent enclosure.

BACKGROUND OF THE INVENTION

The following background information may present examples of specific aspects of the prior art (e.g., without limitation, approaches, facts, or common wisdom) that, while expected to be helpful to further educate the reader as to additional aspects of the prior art, is not to be construed as limiting the present invention, or any embodiments thereof, to anything stated or implied therein or inferred thereupon. It is believed that three-dimensional printers are well-known devices that are typically employed to lay down successive layers of non-conductive material, usually comprised of a plastic or polymer structure, under computer control to form a three dimensional object. However, three-dimensional printers may also be employed for other purposes. For example, without limitation, three-dimensional printers may be employed to print a conductive material within a non-conductive material. The conductive material may include, without limitation, conductive ink, conductive plastic, or conductive polymer structure that may include conductive particles such as, but not limited to, powdered or flaked silver particles therein. In some applications the conductive material within the non-conductive material may be used to form circuits or perform related functions.

In view of the foregoing, it is clear that these traditional techniques are not perfect and leave room for more optimal approaches.

BRIEF DESCRIPTION OF THE DRAWINGS

The present invention is illustrated by way of example, and not by way of limitation, in the figures of the accompanying drawings and in which like reference numerals refer to similar elements and in which:

FIG. 3A is an exploded front perspective view, and FIG. 3B is a cutaway top perspective view.

Figure 1:
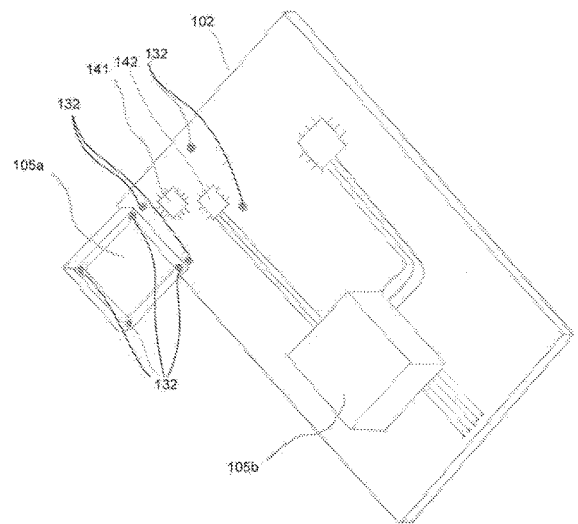
FIG. 1 is a top perspective view of exemplary electrical information devices mounted to a printed circuit board (PCB) that may be covered by exemplary tamper respondent enclosures, in accordance with an embodiment of the present invention.

Unless otherwise indicated illustrations in the figures are not necessarily drawn to scale.

DETAILED DESCRIPTION OF SOME EMBODIMENTS

The present invention is best understood by reference to the detailed figures and description set forth herein.

Embodiments of the invention are discussed below with reference to the Figures. However, those skilled in the art will readily appreciate that the detailed description given herein with respect to these figures is for explanatory purposes as the invention extends beyond these limited embodiments. For example, it should be appreciated that those skilled in the art will, in light of the teachings of the present invention, recognize a multiplicity of alternate and suitable approaches, depending upon the needs of the particular application, to implement the functionality of any given detail described herein, beyond the particular implementation choices in the following embodiments described and shown. That is, there are numerous modifications and variations of the invention that are too numerous to be listed but that all fit within the scope of the invention. Also, singular words should be read as plural and vice versa and masculine as feminine and vice versa, where appropriate, and alternative embodiments do not necessarily imply that the two are mutually exclusive.

It is to be further understood that the present invention is not limited to the particular methodology, compounds, materials, manufacturing techniques, uses, and applications, described herein, as these may vary. It is also to be understood that the terminology used herein is used for the purpose of describing particular embodiments only, and is not intended to limit the scope of the present invention. It must be noted that as used herein and in the appended claims, the singular forms "a," "an," and "the" include the plural reference unless the context clearly dictates otherwise. Thus, for example, a reference to "an element" is a reference to one or more elements and includes equivalents thereof known to those skilled in the art. Similarly, for another example, a reference to "a step" or "a means" is a reference to one or more steps or means and may include sub-steps and subservient means. All conjunctions used are to be understood in the most inclusive sense possible. Thus, the word "or" should be understood as having the definition of a logical "or" rather than that of a logical "exclusive or" unless the context clearly necessitates otherwise. Structures described herein are to be understood also to refer to functional equivalents of such structures. Language that may be construed to express approximation should be so understood unless the context clearly dictates otherwise.

Unless defined otherwise, all technical and scientific terms used herein have the same meanings as commonly understood by one of ordinary skill in the art to which this invention belongs. Preferred methods, techniques, devices, and materials are described, although any methods, techniques, devices, or materials similar or equivalent to those described herein may be used in the practice or testing of the present invention. Structures described herein are to be understood also to refer to functional equivalents of such structures. The present invention will now be described in detail with reference to embodiments thereof as illustrated in the accompanying drawings.

From reading the present disclosure, other variations and modifications will be apparent to persons skilled in the art. Such variations and modifications may involve equivalent and other features which are already known in the art, and which may be used instead of or in addition to features already described herein.

Although Claims have been formulated in this Application to particular combinations of features, it should be understood that the scope of the disclosure of the present invention also includes any novel feature or any novel combination of features disclosed herein either explicitly or implicitly or any generalization thereof, whether or not it relates to the same invention as presently claimed in any Claim and whether or not it mitigates any or all of the same technical problems as does the present invention.

Features which are described in the context of separate embodiments may also be provided in combination in a single embodiment. Conversely, various features which are, for brevity, described in the context of a single embodiment, may also be provided separately or in any suitable subcombination. The Applicants hereby give notice that new Claims may be formulated to such features and/or combinations of such features during the prosecution of the present Application or of any further Application derived therefrom.

References to "one embodiment," "an embodiment," "example embodiment," "various embodiments," etc., may indicate that the embodiment(s) of the invention so described may include a particular feature, structure, or characteristic, but not every embodiment necessarily includes the particular feature, structure, or characteristic. Further, repeated use of the phrase "in one embodiment," or "in an exemplary embodiment," do not necessarily refer to the same embodiment, although they may.

Headings provided herein are for convenience and are not to be taken as limiting the disclosure in any way.

The enumerated listing of items does not imply that any or all of the items are mutually exclusive, unless expressly specified otherwise.

It is understood that the use of specific component, device and/or parameter names are for example only and not meant to imply any limitations on the invention. The invention may thus be implemented with different nomenclature/terminology utilized to describe the mechanisms/units/structures/components/devices/parameters herein, without limitation. Each term utilized herein is to be given its broadest interpretation given the context in which that term is utilized.

TERMINOLOGY

The following paragraphs provide definitions and/or context for terms found in this disclosure (including the appended claims):

"Comprising." This term is open-ended. As used in the appended claims, this term does not foreclose additional structure or steps. Consider a claim that recites: "A memory controller comprising a system cache . . . ." Such a claim does not foreclose the memory controller from including additional components (e.g., a memory channel unit, a switch).

"Configured To." Various units, circuits, or other components may be described or claimed as "configured to" perform a task or tasks. In such contexts, "configured to" or "operable for" is used to connote structure by indicating that the mechanisms/units/circuits/components include structure (e.g., circuitry and/or mechanisms) that performs the task or tasks during operation. As such, the mechanisms/unit/circuit/component can be said to be configured to (or be operable) for perform(ing) the task even when the specified mechanisms/unit/circuit/component is not currently operational (e.g., is not on). The mechanisms/units/circuits/components used with the "configured to" or "operable for" language include hardware—for example, mechanisms, structures, electronics, circuits, memory storing program instructions executable to implement the operation, etc. Reciting that a mechanism/unit/circuit/component is "configured to" or "operable for" perform(ing) one or more tasks is expressly intended not to invoke 35 U.S.C. sctn. 112, sixth paragraph, for that mechanism/unit/circuit/component. "Configured to" may also include adapting a manufacturing process to fabricate devices or components that are adapted to implement or perform one or more tasks.

"Based On." As used herein, this term is used to describe one or more factors that affect a determination. This term does not foreclose additional factors that may affect a determination. That is, a determination may be solely based on those factors or based, at least in part, on those factors. Consider the phrase "determine A based on B." While B may be a factor that affects the determination of A, such a phrase does not foreclose the determination of A from also being based on C. In other instances, A may be determined based solely on B.

The terms "a", "an" and "the" mean "one or more", unless expressly specified otherwise.

Unless otherwise indicated, all numbers expressing conditions, concentrations, dimensions, and so forth used in the specification and claims are to be understood as being modified in all instances by the term "about." Accordingly, unless indicated to the contrary, the numerical parameters set forth in the following specification and attached claims are approximations that may vary depending at least upon a specific analytical technique.

The term "comprising," which is synonymous with "including," "containing," or "characterized by" is inclusive or open-ended and does not exclude additional, unrecited elements or method steps. "Comprising" is a term of art used in claim language which means that the named claim elements are essential, but other claim elements may be added and still form a construct within the scope of the claim.

As used herein, the phase "consisting of" excludes any element, step, or ingredient not specified in the claim. When the phrase "consists of" (or variations thereof) appears in a clause of the body of a claim, rather than immediately following the preamble, it limits only the element set forth in that clause; other elements are not excluded from the claim as a whole. As used herein, the phase "consisting essentially of" limits the scope of a claim to the specified elements or method steps, plus those that do not materially affect the basis and novel characteristic(s) of the claimed subject matter.

With respect to the terms "comprising," "consisting of," and "consisting essentially of," where one of these three terms is used herein, the presently disclosed and claimed subject matter may include the use of either of the other two terms. Thus in some embodiments not otherwise explicitly recited, any instance of "comprising" may be replaced by "consisting of" or, alternatively, by "consisting essentially of."

Devices or system modules that are in at least general communication with each other need not be in continuous communication with each other, unless expressly specified otherwise. In addition, devices or system modules that are in at least general communication with each other may communicate directly or indirectly through one or more intermediaries.

A description of an embodiment with several components in communication with each other does not imply that all such components are required. On the contrary a variety of optional components are described to illustrate the wide variety of possible embodiments of the present invention.

As is well known to those skilled in the art many careful considerations and compromises typically must be made when designing for the optimal manufacture of a commercial implementation any system, and in particular, the embodiments of the present invention. A commercial implementation in accordance with the spirit and teachings of the present invention may configured according to the needs of the particular application, whereby any aspect(s), feature(s), function(s), result(s), component(s), approach(es), or step(s) of the teachings related to any described embodiment of the present invention may be suitably omitted, included, adapted, mixed and matched, or improved and/or optimized by those skilled in the art, using their average skills and known techniques, to achieve the desired implementation that addresses the needs of the particular application.

In the following description and claims, the terms "coupled" and "connected," along with their derivatives, may be used. It should be understood that these terms are not intended as synonyms for each other. Rather, in particular embodiments, "connected" may be used to indicate that two or more elements are in direct physical or electrical contact with each other. "Coupled" may mean that two or more elements are in direct physical or electrical contact. However, "coupled" may also mean that two or more elements are not in direct contact with each other, but yet still cooperate or interact with each other.

It is to be understood that any exact measurements/dimensions or particular construction materials indicated herein are solely provided as examples of suitable configurations and are not intended to be limiting in any way. Depending on the needs of the particular application, those skilled in the art will readily recognize, in light of the following teachings, a multiplicity of suitable alternative implementation details.

An embodiment of the present invention may comprise a three-dimensional printed, tamper respondent enclosure, which may provide protection to valuable information that may be stored in electronic devices from unlawful or unauthorized access. Some embodiments may comprise a structure and method for producing a tamper respondent enclosure that may be used to surround an item to be protected, such as, but not limited to, an electronic device carrying potentially valuable information. In these embodiments the enclosure may typically be produced using three-dimensional printing by layering non-conductive material with conductive material and a sensing device to detect penetration of the enclosure. The enclosure may comprise electrical connectors to provide electrical continuity between the conductive material of one surface of the enclosure to the conductive material of another surface of the enclosure and to provide electrical continuity between one surface of the enclosure and a printed circuit board (PCB). In these embodiments, an attempt to penetrate the enclosure typically results in damage to one or more of the lines of conductive material, and this damage may be detectable as a change in an electrical characteristic of the conductive material. On detection of such a change, the information stored within the item may be destroyed or erased to typically prevent an unlawful or unauthorized user from accessing the information.

FIG. 1 is a top perspective view of exemplary electrical information devices 141 mounted to a printed circuit board (PCB) 102 that may be covered by exemplary tamper respondent enclosures 105a and 105b, in accordance with an embodiment of the present invention. In the present embodiment, enclosures 105a and 105b may be configured as coverings that may attach to PCB 102 to enclose electrical information devices 141. Information devices 141 may comprise information, for example, without limitation, an encryption key, which may warrant protection. Thus, information devices 141 may be enclosed inside tamper respondent enclosures 105a and 105b to typically protect information devices 141 from unauthorized access.

In the present embodiment, enclosures 105a and 105b may comprise at least one layer of conductive material and is adapted for mounting on a surface having at least one information device 141 to protect. Other embodiments may comprise an additional enclosure similar to enclosures 105a and 105b that may be applied to the bottom side of the PCB to provide an additional layer of tamper protection on the bottom side of the PCB. Yet other embodiments may be implemented as an enclosure that surrounds the entire PCB, as illustrated by way of example in FIGS. 3A and 3B. Those skilled in the art will readily recognize, in light of and in accordance with the teachings of the present invention, that enclosures may be produced in many shapes and arrangements including, but not limited to surface mount coverings, two half shells, full enclosures, spherical or hemispherical enclosures, hinged enclosures, [t1]etc.

In the present embodiment, enclosure 105a is shown detached from PCB 102 illustrating electrical connectors 132, and enclosure 105b is shown attached to PCB 102 with electrical connectors not shown. Enclosure 105a comprises four electrical connectors 132, one located at each corner of the underside surface of enclosure 105a, which may coordinate with four electrical connectors 132 located on the surface of PCB 102 to typically electrically connect and secure enclosure 105a to PCB 102. Enclosure 105b, shown attached to PCB 102, is electrically connected to PCB 102 at four electrical connectors similar to electrical connectors 132 shown on enclosure 105a. Those skilled in the art will readily recognize, in light of and in accordance with the teachings of the present invention, that some alternate embodiments may be implemented with fewer or more electrical connectors in a multiplicity of suitable configurations to connect enclosures to PCBs. In the present embodiment, electrical connectors 132 may be retained together by any suitable means, including, but not limited to, utilizing conductive adhesive, using one or more of heat and pressure, utilizing mechanical fasteners, etc. It is contemplated that some embodiments may comprise another type of electrical connector which may connect one portion of the enclosure to another portion of the enclosure, as illustrated by way of example in FIG. 3A. In the present embodiment, electrical connectors 132 may typically provide electrical continuity between the conductive material in enclosures 105a and 105b and PCB 102, which may also be connected to a sensing device 142 that may be able to sense attempts to gain access to the electrical information devices 141. Attempts to penetrate enclosures 105a and 105b may typically result in damage to the conductive material within enclosures 105a and 105b and a change in the electrical characteristics of the conductive material. These changes in the electrical characteristics typically occur because the lines of conductive material are usually either bridged together or broken if there is an attempt to breach the enclosure. Sensing device 142 may be configured to detect these changes. On detection of these changes, sensing device 142 may provide an appropriate signal to at least one information device 141, which may delete, erase or destroy the protected information stored on electrical device 141. In some embodiments the signal from the sensing device may also cause an alarm to be activated. One or more sensing devices may be included, without limitation, on PCB 102. In the present embodiment, information device 141 and sensing device 142 are shown as separate devices. In some embodiments, the information device and the sensing device may be combined into a single device comprising both sensing functionality and information storage.

Figure 2:
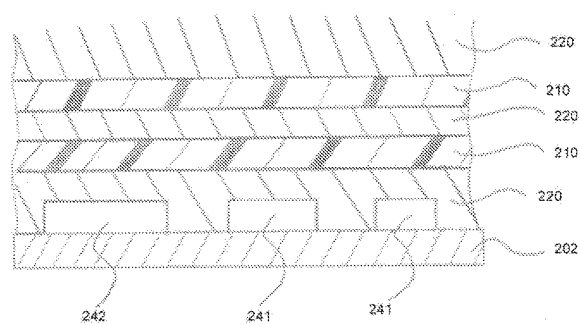
FIG. 2 is a cross-sectional view of an exemplary tamper respondent enclosure, in accordance with an embodiment of the present invention.

FIG. 2 is a cross-sectional view of an exemplary tamper respondent enclosure, in accordance with an embodiment of the present invention. In the present embodiment, the tamper respondent enclosure comprises at least one layer of conductive material 210 and at least one layer of non-conductive material 220 covering at least one information device 241 to be protected and at least one sensing device 242 on a PCB 202. Conductive material 210 is typically an electrically conductive material that may be configured to overlap to form continuous electrically conductive paths, which may be damaged if attempts are made to penetrate the enclosure. Conductive material 210 may be produced in any shape, arrangement, or appropriate pattern forming a continuous conductor, such as, but not limited to, serpentine patterns, rectilinear patterns, zigzag patterns, spiral patterns, etc. In some embodiments the conductive material may form multiple conductive paths that may connect to the same or separate electrical connectors and sensing devices. In the present embodiment, conductive material 210 may be comprised of a multiplicity of suitable materials including, without limitation, conductive ink, conductive plastic, conductive polymer material, various other non-ink, non-plastic and non-polymer materials, materials comprising conductive particles, metal, thermoplastic polyurethane, carbon nanotubes, carbon black etc. In the present embodiment, non-conductive material 220 typically comprises material that is not electrically conductive and may act as insulation around the electrically conductive paths of conductive material 210. Non-conductive material 220 may be comprised of a plastic or polymer material, however various different non-plastic and non-polymer materials may be utilized for the non-conductive material in some embodiments such as, but not limited to, rubber, polyurethane, etc. Non-conductive material 220 layer may be produced in any appropriate pattern to insulate conductive material 210. Non-conductive material may also form the shape of the enclosure. In some alternate embodiments the non-conductive material may be used to insulate the conductive material, and a different material may be used to form the shape of the enclosure. In the present embodiment, conductive material 210 and non-conductive material 220 may be formed by being extruded or deposited in successive layers by means of three-dimensional printing, which may be easier, less time consuming, and less expensive than other production means. However, it is contemplated that some embodiments may be produced using a multiplicity of suitable alternative means such as, but not limited to, injection molding, plastic extrusion, pressing methods, etc.

It is contemplated that some embodiments may comprise features that may add to the security of the tamper respondent enclosure. For example, without limitation, in some embodiments the conductive material may be non-differentiable from a non-conductive material or difficult to distinguish from the non-conductive material under X-ray imaging. This may prevent an intruder from using X-ray imaging to identify where the conductive lines are located in an attempt to bypass the conductive material and access the device inside the enclosure. In some embodiments the conductive material may be of such composition that it may be nearly impossible for the lines of conductive material to be electrically bridged, for example, without limitation, by soldered wire links as used to bridge metallic lines. In some embodiments, the cohesive strength of the conductive material may be less than that of the non-conductive material, which may ensure that attempts to delaminate the conductive material from the non-conductive material will typically result in fracture of the conductive material.

Figure 3A:
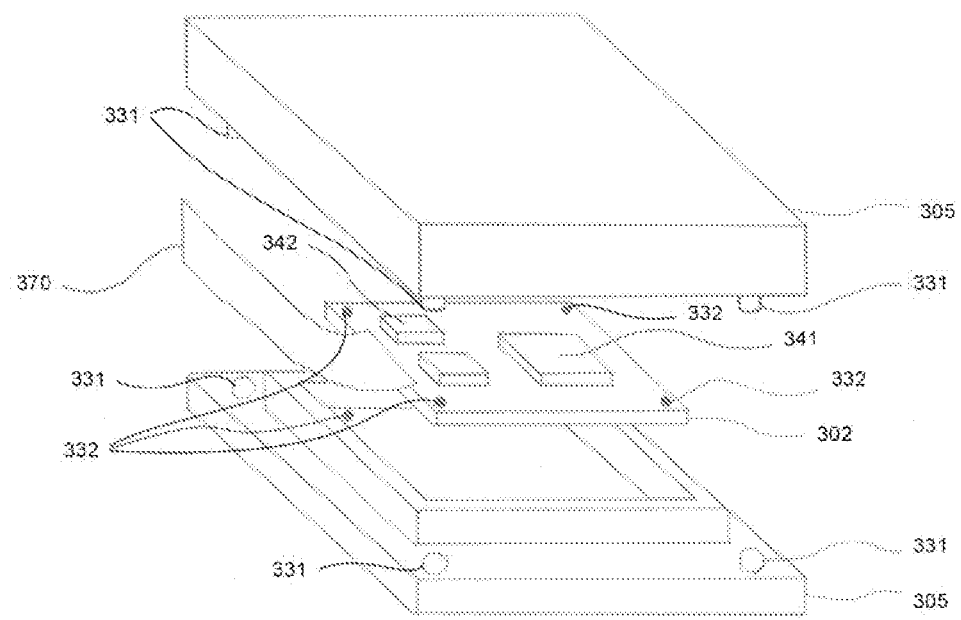
FIGS. 3A and 3B illustrate an exemplary tamper respondent enclosure comprising a box structure to enclose electrical devices on a PCB.
Figure 3B:
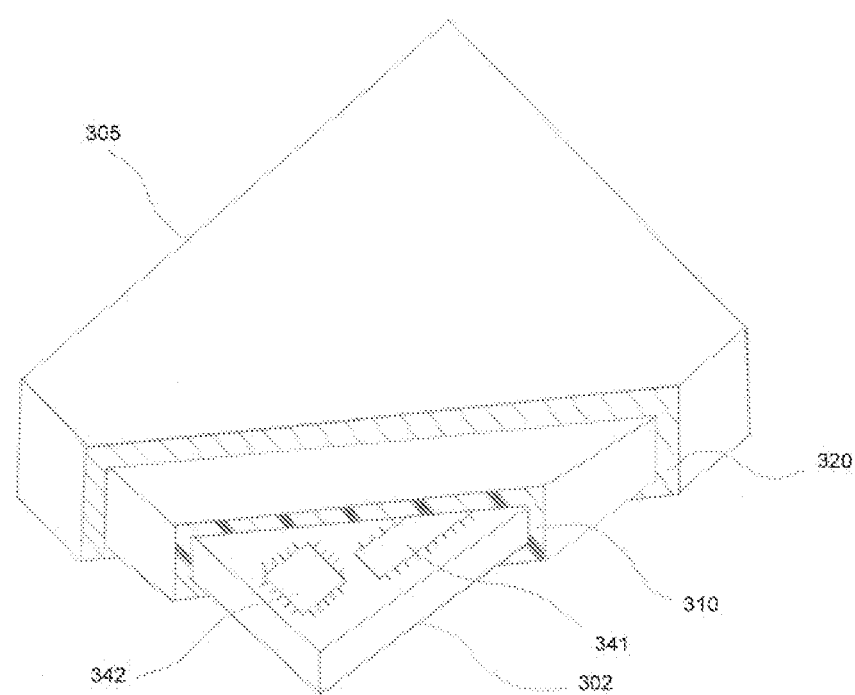

FIGS. 3A and 3B illustrate an exemplary tamper respondent enclosure 305 comprising a box structure to enclose electrical information devices 341 on a PCB 302. FIG. 3A is an exploded front perspective view, and FIG. 3B is a cutaway top perspective view. In the present embodiment, enclosure 305 comprises two half shells that may be fixed together such that they enclose PCB 302 containing an information device 341 to be protected. Tamper respondent enclosure 305 comprises conductive material 310 and non-conductive material 320 where non-conductive material 310 is layered with lines of conductive material 320 that surround information devices 341. Electrical connectors 331 may provide electrical continuity between the conductive material contained within the separate portions of enclosure 305 by pad-to-pad contact between four electrical connectors 331 on one portion of enclosure 305 inserted into four electrical connectors 331 on the other portion of enclosure 305. Connectors 331 may be retained together by any suitable means, including, without limitation, conductive adhesive, using one or more of heat and pressure, mechanical fasteners, etc. Similarly, electrical continuity may be provided between PCB 302 and conductive material 310 within enclosure 305 by pad-to-pad contact at four electrical connectors 332 located on PCB 302 and four electrical connectors 332 located on the surface of enclosure 305. Some alternate embodiments may have more or fewer electrical connectors between portions of the enclosure and between the enclosure and the PCB. Furthermore, these electrical connectors may be arranged in various different configurations. In the present embodiment, PCB 302 may also be connected to a sensing device 342 that may be able to detect changes in the electrical characteristics of conductive material 310. Referring to FIG. 3B, in the present embodiment, conductive material 310 forms the inner layer of enclosure 305 which is comprised of electrically conductive lines of conductive material that can be produced using three-dimensional printing or other means of production. Non-conductive material 320 may form the outer layer of enclosure 305, which is comprised of material that is typically not electrically conductive to forms insulation around conductive material 310. Non-conductive material 320 may also be formed using three-dimensional printing or other appropriate means.

Referring to FIG. 3A, a ribbon cable 370 may provide electrical continuity from inside enclosure 305 to outside enclosure 305. As illustrated, ribbon cable 370 may be connected to PCB 302 so that PCB 302 along with connected information device 341 and sensing device 342 may be provided power from outside enclosure 305 by an external power supply and may also communicate electrically using appropriate electrical signals. Ribbon cable 370 may also provide electrical output capability through enclosure 305. Ribbon cable 370 may typically be thin enough to fit through the space between the two portions of enclosure 305. In some embodiments virtually any appropriate type of cable may be used to connect the PCB to elements outside the enclosure, such as, but not limited to, twisted pair cables, coaxial cables, fiber optic cables, etc. In other embodiments, the cable may be replaced with a receptacle that may enable external devices including, without limitation, an external power supply to be connected to the enclosure. In these embodiments, any appropriate type of connector may be used, such as, but not limited to, a DB9 serial connector, a RJ-45 Ethernet connector, a USB connector, etc.

In typical use of the present embodiment, one or more of the lines of conductive material 310 may be damaged if there is any attempt to breach enclosure 305, for example, without limitation, in the form of intrusion or dismantling of enclosure 305. Such a breach of enclosure 305 may trigger an electrical state change in conductive material 310 that may be detected by sensing device 342. After detecting a change, sensing device 342 may send an appropriate signal to information device 341 to take necessary action, such as, but not limited to, erasing, destroying, incinerating, or encrypting any valuable information that is stored on information device 341 to typically prevent the information from being obtained by unauthorized users. In some embodiments, sensing device 342 may also cause an alarm to be activated.

Those skilled in the art will readily recognize, in light of and in accordance with the teachings of the present invention, that some embodiments may comprise a multiplicity of suitable alternate or additional features such as, but not limited to, warning labels, voice recorded messages, etc. Some embodiments may comprise lights that indicate if the enclosure is properly engaged. Some embodiments may comprise means for safely removing the enclosures such as, but not limited to, keys or means for inputting passcodes.

All the features disclosed in this specification, including any accompanying abstract and drawings, may be replaced by alternative features serving the same, equivalent or similar purpose, unless expressly stated otherwise. Thus, unless expressly stated otherwise, each feature disclosed is one example only of a generic series of equivalent or similar features.

It is noted that according to USA law 35 USC §112 (1), all claims must be supported by sufficient disclosure in the present patent specification, and any material known to those skilled in the art need not be explicitly disclosed. However, 35 USC §112 (6) requires that structures corresponding to functional limitations interpreted under 35 USC §112 (6) must be explicitly disclosed in the patent specification. Moreover, the USPTO's Examination policy of initially treating and searching prior art under the broadest interpretation of a "mean for" claim limitation implies that the broadest initial search on 112 (6) functional limitation would have to be conducted to support a legally valid Examination on that USPTO policy for broadest interpretation of "mean for" claims. Accordingly, the USPTO will have discovered a multiplicity of prior art documents including disclosure of specific structures and elements which are suitable to act as corresponding structures to satisfy all functional limitations in the below claims that are interpreted under 35 USC §112 (6) when such corresponding structures are not explicitly disclosed in the foregoing patent specification. Therefore, for any invention element(s)/structure(s) corresponding to functional claim limitation(s), in the below claims interpreted under 35 USC §112 (6), which is/are not explicitly disclosed in the foregoing patent specification, yet do exist in the patent and/or non-patent documents found during the course of USPTO searching, Applicant(s) incorporate all such functionally corresponding structures and related enabling material herein by reference for the purpose of providing explicit structures that implement the functional means claimed. Applicant(s) request(s) that fact finders during any claims construction proceedings and/or examination of patent allowability properly identify and incorporate only the portions of each of these documents discovered during the broadest interpretation search of 35 USC §112 (6) limitation, which exist in at least one of the patent and/or non-patent documents found during the course of normal USPTO searching and or supplied to the USPTO during prosecution. Applicant(s) also incorporate by reference the bibliographic citation information to identify all such documents comprising functionally corresponding structures and related enabling material as listed in any PTO Form-892 or likewise any information disclosure statements (IDS) entered into the present patent application by the USPTO or Applicant(s) or any $3^{rd}$ parties. Applicant(s) also reserve its right to later amend the present application to explicitly include citations to such documents and/or explicitly include the functionally corresponding structures which were incorporate by reference above.

Thus, for any invention element(s)/structure(s) corresponding to functional claim limitation(s), in the below claims, that are interpreted under 35 USC §112 (6), which is/are not explicitly disclosed in the foregoing patent specification, Applicant(s) have explicitly prescribed which documents and material to include the otherwise missing disclosure, and have prescribed exactly which portions of such patent and/or non-patent documents should be incorporated by such reference for the purpose of satisfying the disclosure requirements of 35 USC §112 (6). Applicant(s) note that all the identified documents above which are incorporated by reference to satisfy 35 USC §112 (6) necessarily have a filing and/or publication date prior to that of the instant application, and thus are valid prior documents to incorporated by reference in the instant application.

Having fully described at least one embodiment of the present invention, other equivalent or alternative methods of implementing a three-dimensional printed, tamper respondent enclosure according to the present invention will be apparent to those skilled in the art. Various aspects of the invention have been described above by way of illustration, and the specific embodiments disclosed are not intended to limit the invention to the particular forms disclosed. The particular implementation of the tamper respondent enclosure may vary depending upon the particular context or application. By way of example, and not limitation, the tamper respondent enclosures described in the foregoing were principally directed to implementations for protecting electronic information; however, similar techniques may instead be applied to tamper respondent enclosures configured to protect various different items such as, but not limited to, physical credit cards, sensitive documents, or identification cards, which implementations of the present invention are contemplated as within the scope of the present invention. The invention is thus to cover all modifications, equivalents, and alternatives falling within the spirit and scope of the following claims. It is to be further understood that not all of the disclosed embodiments in the foregoing specification will necessarily satisfy or achieve each of the objects, advantages, or improvements described in the foregoing specification.

Claim elements and steps herein may have been numbered and/or lettered solely as an aid in readability and understanding. Any such numbering and lettering in itself is not intended to and should not be taken to indicate the ordering of elements and/or steps in the claims.

The corresponding structures, materials, acts, and equivalents of all means or step plus function elements in the claims below are intended to include any structure, material, or act for performing the function in combination with other claimed elements as specifically claimed.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The Abstract is provided to comply with 37 C.F.R. Section 1.72(b) requiring an abstract that will allow the reader to ascertain the nature and gist of the technical disclosure. It is submitted with the understanding that it will not be used to limit or interpret the scope or meaning of the claims. The following claims are hereby incorporated into the detailed description, with each claim standing on its own as a separate embodiment.

What is claimed is:

1. An apparatus, comprising;
   a tamper respondent enclosure implement comprising;
   an electrically conductive material layer section configured to substantially form continuous electrically conductive paths, in which said electrically conductive material layer section comprising at least a first and second electrically conductive material layer segment;
   an electrically non-conductive material layer section configured to substantially insulate said electrically conductive material layer, in which said electrically non-conductive material layer section comprising at least a first, second and third electrically non-conductive material layer segment;
   whereby said at least first and second conductive material layer segments and said at least first and second non-conductive material layer section are configured to form alternating successive layers;
   wherein said first electrically non-conductive material layer segment generally forms an outer layer of said enclosure; and
   wherein said first and second electrically conductive material layer segment forms at least an inner layer of said extrusion of said three dimensional printer device, and wherein a cohesive strength of said first conductive material layer segment is configured to be less than a cohesive strength of said first and second non-conductive material layer segment and a cohesive strength of said second conductive material layer segment is configured to be less than a cohesive strength of said second non-conductive material layer segment, in which said cohesive strength of said first conductive material layer segment is further configured to be operable to ensure attempts to delaminate said first conductive material layer segment from said first non-conductive material layer segment will result in a substantial fracture of said first conductive material layer segment and said cohesive strength of said second conductive material layer segment is further configured to be operable to ensure attempts to delaminate at least one of, said first and second conductive material layer segment from said second non-conductive material layer segment will result in a substantial fracture of at least one of, said first and second conductive material layer segment; and
   an electrical connector at a corner of an underside surface of said tamper respondent enclosure implement, in which said electrical connector comprise of at least two or more electrical connectors.

2. The apparatus of claim 1, wherein said tamper respondent enclosure implement is formed around an object to protect, in which said at least two or more electrical connectors being disposed at each corner of an underside surface of said tamper respondent enclosure implement, and wherein said at least two or more electrical connectors being configured to coordinate with electrical connectors disposed on a surface of said object to generally provide electrical connection and secure said tamper respondent enclosure implement to said object.

3. The apparatus of claim 1, wherein said tamper respondent enclosure implement is configured to be mounted on a surface of a printed circuit board, in which;
   said electrical connector being configured to provide electrical continuity between said first and second conductive material layer segments and said printed circuit board; and
   said apparatus further comprising a sensing device connected to said first and second conductive material layer segments, wherein said sensing device is configured to sense attempts to tamper said first and second conductive material layer segments.

4. The apparatus of claim 1, wherein said electrically conductive material layer section is non-differentiable from said non-conductive material layer section by X-ray imaging.

5. The apparatus of claim 1, wherein said electrically conductive material layer section generally forms electrically conductive paths around a device to protect.

6. The apparatus of claim 5, wherein said electrically conductive material layer section forms a serpentine pattern.

7. The apparatus of claim 5, wherein said electrically conductive material layer section generally forms a rectilinear pattern.

8. The apparatus of claim 5, wherein said electrically conductive material layer section generally forms a zigzag pattern.

9. The apparatus of claim 1, wherein said electrically conductive material layer section is comprised of at least a conductive ink.

10. The apparatus of claim 1, wherein said electrically conductive material layer section is comprised of at least a conductive plastic.

11. The apparatus of claim 1, wherein said electrically conductive material layer section is comprised of at least a conductive polymer.

12. The apparatus of claim 1, wherein said electrically conductive material layer section contains at least conductive particles.

13. The apparatus of claim 1, wherein said electrically conductive material layer section is comprised of at least a metal.

14. The apparatus of claim 5, further comprising a sensing device, said sensing device is coupled to said tamper respondent enclosure implement through said electrical connector, wherein said sensing device is configured to detect changes in the electrical characteristic of said tamper respondent enclosure implement.

15. The apparatus of claim 14, further comprising an information device, said information device is coupled to said sensing device, wherein said sensing device is configured to provide a signal to said information device upon a detection of a change in the electrical characteristic of said tamper respondent enclosure implement.

16. The apparatus of claim 1, in which said tamper respondent enclosure implement comprise of at least two or more tamper respondent enclosures, wherein said at least two or more electrical connectors is configured to provide electrical continuity of said at least two or more tamper respondent enclosures.

* * * * *